United States Patent
Jin et al.

(10) Patent No.: US 9,829,170 B2
(45) Date of Patent: Nov. 28, 2017

(54) OLED DIODE SUPPORT WITH ELASTIC CONNECTION BLADES

(71) Applicant: Valeo Vision, Bobigny (FR)

(72) Inventors: Hui Jin, Paris (FR); Christophe Dubosc, Villemomble (FR); David Hue, Butry sur Oise (FR); Maxime Briand, Change (FR); Zdravko Zojceski, Courbevoie (FR)

(73) Assignee: Valeo Vision, Bobigny (FR)

( * ) Notice: Subject to any disclaimer, the term of this patent is extended or adjusted under 35 U.S.C. 154(b) by 207 days.

(21) Appl. No.: 14/853,267

(22) Filed: Sep. 14, 2015

(65) Prior Publication Data
US 2016/0084466 A1 Mar. 24, 2016

(30) Foreign Application Priority Data

Sep. 15, 2014 (FR) .................................... 14 58674

(51) Int. Cl.
| *H01R 12/52* | (2011.01) |
| --- | --- |
| *F21S 8/10* | (2006.01) |
| *H01R 12/71* | (2011.01) |
| H01R 12/00 | (2006.01) |
| H01R 13/24 | (2006.01) |
| H05K 1/02 | (2006.01) |
| H05K 3/18 | (2006.01) |
| F21Y 105/00 | (2016.01) |
| F21Y 115/15 | (2016.01) |

(52) U.S. Cl.
CPC ........... *F21S 48/212* (2013.01); *F21S 48/217* (2013.01); *H01R 12/714* (2013.01); *F21Y 2105/00* (2013.01); *F21Y 2115/15* (2016.08); H01R 9/096 (2013.01); H01R 12/52 (2013.01); H01R 13/2435 (2013.01); H05K 1/0284 (2013.01); H05K 3/185 (2013.01); H05K 2201/09118 (2013.01); H05K 2201/10386 (2013.01)

(58) Field of Classification Search
CPC .............................. H01R 9/096; H01R 12/52
See application file for complete search history.

(56) References Cited

U.S. PATENT DOCUMENTS

| 3,624,587 A | 11/1971 | Conrad |
| 4,486,066 A | 12/1984 | Minter |

(Continued)

FOREIGN PATENT DOCUMENTS

| DE | 202011101629 U1 | 9/2012 |
| DE | 202013105597 U1 | 2/2014 |
| FR | 2995657 A1 | 3/2014 |

*Primary Examiner* — Tho D Ta
(74) *Attorney, Agent, or Firm* — Jacox, Meckstroth & Jenkins

(57) ABSTRACT

The invention deals with a support for light source(s) for a light module, notably for a motor vehicle, comprising a substrate; at least one surface light source of the organic light-emitting diode type supported by the substrate, the at least one surface light source comprising, at one or more edges, at least two electrical contact zones; electrical tracks deposited on the substrate; and electrical contacts between the electrical contact zones of the light source or sources and the electrical tracks. The electrical contacts comprise elastic blades, in contact under pressure with the contact zone or zones of the surface light source or sources and with the electrical tracks on the substrate.

20 Claims, 3 Drawing Sheets

(56) References Cited

U.S. PATENT DOCUMENTS

| | | | |
|---|---|---|---|
| 6,565,231 B1 | 5/2003 | Cok | |
| 7,462,036 B2 * | 12/2008 | Shin | H01R 12/721 |
| | | | 439/289 |
| 7,824,072 B2 * | 11/2010 | Cheng | G02F 1/133604 |
| | | | 362/217.17 |
| 8,043,120 B2 * | 10/2011 | Tsai | G02F 1/133604 |
| | | | 439/59 |
| 8,628,342 B2 | 1/2014 | Tremblay et al. | |
| 2007/0230169 A1 * | 10/2007 | Kwon | F21V 19/008 |
| | | | 362/217.05 |
| 2013/0323938 A1 | 12/2013 | Tremblay et al. | |
| 2014/0056020 A1 | 2/2014 | Bungentock et al. | |

* cited by examiner

OLED DIODE SUPPORT WITH ELASTIC CONNECTION BLADES

CROSS-REFERENCE TO RELATED APPLICATIONS

This application claims priority to the French application 1458674 filed on Sep. 15, 2014, which application is incorporated herein by reference and made a part hereof.

BACKGROUND OF THE INVENTION

1. Field of the Invention

The invention deals with the field of lighting and/or light indication, notably for a motor vehicle. More specifically, the invention deals with the field of lighting and of light indication by means of light-emitting diodes (LED) and organic light-emitting diodes (OLED).

2. Description of the Related Art

The published patent document DE 20 2013 105 597 U discloses a surface light source support of OLED diode type. The support comprises an extended substrate supporting the OLED diode and a cover extending essentially at right angles to the substrate. The OLED diode passes through the cover and comprises electrical connection zones. This document discloses, in paragraphs [0113] and [0139], that the substrate can comprise electrical contacts cooperating with the diode on its part on the side of the cover. This document does not however give any more detail on the nature and the configuration of these electrical contacts.

The published patent document US 2014/0056020 A1 discloses a light module for a motor vehicle, comprising a series of surface light sources of OLED type. These OLED diodes are arranged in a circular manner. This document does not however seem to detail the manner in which the OLED diodes are supported. The latter comprise electrical connectors protruding from an edge. This document does not however give any more detail on the manner in which these connectors are linked to a power supply device.

The published patent document FR 2 995 657 A1 discloses a light source with diodes of the OLED type, comprising a support with cavities filled by the diodes. The support comprises, on one of its faces, electrodes or electrical tracks intended to electrically contact the diodes for their electrical power supply. The diodes comprise a stack of organic layers and a transparent substrate arranged on the stack concerned. The substrate has a surface area of a size greater than that of the organic layers in order to extend beyond the corresponding cavity and thus come into contact with the electrical tracks, around the cavity. The support is produced by injection of insulating material such as thermoplastic or thermosetting plastic. It can be planar, with a dip or even of more complex form. The electrical connection between the electrical tracks and the OLED diodes is advantageous in that it is produced when the diodes are placed in their respective cavities. This type of connection is however limited to a very specific configuration in which the diodes are inserted into cavities.

SUMMARY OF THE INVENTION

The object of the invention is to propose a support for surface light source(s) of the OLED type with an effective connection system.

The subject of the invention is a support for light source(s) for a light module, notably for a motor vehicle, comprising: a substrate; at least one surface light source of the organic light-emitting diode type supported by the substrate, the at least one surface light source comprising at least two electrical contact zones; electrical tracks deposited on the substrate; electrical contacts between the electrical tracks and the electrical contact zones of the light source or sources; noteworthy in that the electrical contacts comprise elastic blades, in contact under pressure with the contact zones of the at least one surface light source and with the electrical tracks.

The at least two electrical contact zones of the at least one surface light source are advantageously situated at one or more edges of the at least one surface light source.

Advantageously, the electrical tracks are produced via a metallic coating deposited on the substrate. Where appropriate, the metallic coating of the electrical tracks at the point of electrical contact is chosen so as to be compatible with the electrical contact in the place of the electrical tracks. The metallic coating in the place of the electrical contact and the electrical contact in the place of the electrical tracks can for example each include a top layer at least 1μ thick comprising a nickel-gold alloy, so as to guarantee the reliability of the electrical contact. As a variant, other alloys such as tin, silver or nickel-palladium-gold can be chosen. If so desired, the at least two electrical contact zones can be lubricated so as to increase the reliability of the electrical contact.

According to an advantageous embodiment of the invention, the at least two electrical contact zones of the at least one surface light source in electrical contact with an electrical track forms an angle with the zone of the electrical track in contact with the elastic blade, the angle being preferentially greater than 30°, more preferentially 50°.

According to an advantageous embodiment of the invention, the at least one surface light source comprises two opposing main faces, the at least two electrical contact zones of said the at least one surface light source being situated on one of the faces. The slice of the edges with the at least two electrical contact zones is preferentially free of electrical contact with said the at least two electrical contact zones.

According to an advantageous embodiment of the invention, each of the elastic blades comprises at least two bent portions, each of the at least two bent portions being in contact with one of the at least two electrical contact zones of the at least one surface light source or with one of the electrical tracks.

According to an advantageous embodiment of the invention, each of the at least two bent portions forms an angle less than 120°, preferentially less than 110°, more preferentially less than 100°.

According to an advantageous embodiment of the invention, each of the elastic blades comprises, at at least one, preferentially at both, of its ends, a generally planar portion suitable for sliding along a guiding surface.

According to an advantageous embodiment of the invention, the support comprises an added part supporting the elastic blades.

According to an advantageous embodiment of the invention, the added part comprises the guiding surfaces for the planar end portions of the elastic blades.

According to an advantageous embodiment of the invention, the added part comprises grooves forming the guiding surfaces and receiving the planar end portions of the elastic blades. Advantageously, the grooves can be formed by one and the same notch of crenellated form, each crenellation forming one of the grooves.

According to an advantageous embodiment of the invention, the substrate comprises an extended portion, preferentially generally planar, with two opposing main faces and an edge, the electrical tracks being deposited on at least one of the two opposing main faces of the extended portion, the at least one surface light source extending transversely to the extended portion with an edge provided with the at least two electrical contact zones adjacent to one of the two opposing main faces. The support preferentially comprises two surface light sources extending essentially opposite one another.

According to an advantageous embodiment of the invention, the at least one surface light source forms an angle of less than 30° with a direction at right angles to the mean plane of the extended portion, the angle being preferentially less than 25°, more preferentially less than 20°.

According to an advantageous embodiment of the invention, the added part comprises at least one edge supporting the elastic blades.

According to an advantageous embodiment of the invention, the elastic blades overlap the edge or edges of the added part.

According to an advantageous embodiment of the invention, the added part comprises two edges supporting the elastic blades, the two edges extending essentially parallel to one another, the added part comprising a main groove between the edges, said the main groove receiving the edge of the extended portion of the substrate.

According to an advantageous embodiment of the invention, the elastic blades comprise first blades each overlapping exclusively one of the two edges.

According to an advantageous embodiment of the invention, the first blades have a generally U-shaped profile and ensure an electrical contact between electrical tracks and the at least two electrical contact zones of the at least one surface light source.

According to an advantageous embodiment of the invention, the blades comprise second blades, each of the second blades overlapping the two edges and extending through the groove of the added part.

According to an advantageous embodiment of the invention, the second blades have a profile comprising two generally U-shaped lateral portions each overlapping one of the two edges and a central portion, preferentially generally U-shaped, opposite the U shapes of the lateral portions.

According to an advantageous embodiment of the invention, the second blades ensure an electrical contact between the at least two electrical contact zones of two surface light sources arranged on either side of the generally planar portion of the substrate.

According to an advantageous embodiment of the invention, the edge of the extended portion of the substrate forms a protruding tongue, the electrical tracks on the substrate extending to the tongue, the added part comprising a notch or an opening suitable for receiving the tongue so as to form a space for it to engage with an electrical connector.

According to an advantageous embodiment of the invention, the added part comprises portions protruding from the extended portion of the substrate and intended to support the at least one surface light source.

According to an advantageous embodiment of the invention, the support comprises additional light sources of the light-emitting type which are glued directly onto the substrate, said the additional light sources being linked electrically to the electrical tracks.

Another subject of the invention is a light module, notably for a motor vehicle, comprising a support for light source(s) and at least one optical device, noteworthy in that the support conforms to the invention.

The provisions of the invention are advantageous in that they make it possible to produce an electrical connection of the surface light sources cleanly, simply and effectively. The blades can in fact be put in place on the added part. When assembling the support, the fitting of the added part will then ensure not only the mechanical securing of the surface light sources but also their electrical connection to the substrate.

Other features and advantages of the present invention will be better understood from the description and the drawings in which:

These and other objects and advantages of the invention will be apparent from the following description, the accompanying drawings and the appended claims.

BRIEF DESCRIPTION OF THE ACCOMPANYING DRAWINGS

DETAILED DESCRIPTION OF THE PREFERRED EMBODIMENTS

Figure 1:
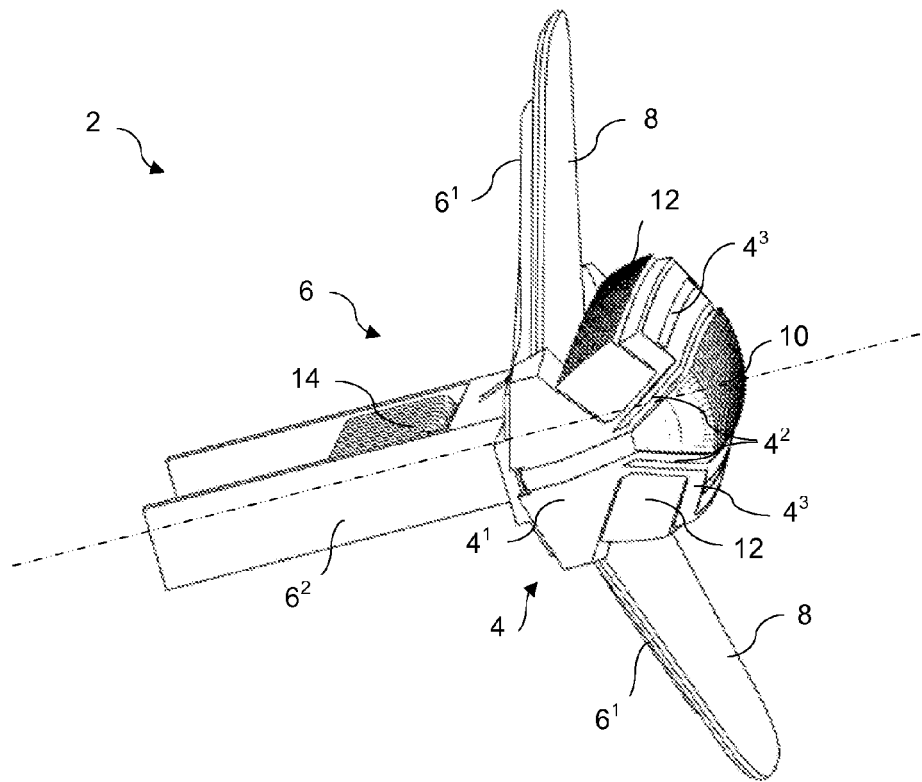
FIG. 1 is a perspective view of a light module comprising a light source support according to the invention.

FIG. 1 illustrates a light indication module for a motor vehicle. The module 2 is configured to be housed in a casing arranged at the rear of the vehicle. It is configured to ensure a side marker light (or rear light) function, a stop light function and a direction indicator (or flashing) function.

The module 2 comprises a substrate 4 and a part 6 added onto the substrate 4. The added part 6 can be fixed to the substrate 4 by means of screws. The substrate 4 essentially comprises a central part $4^1$, two lateral walls $4^2$, two front walls $4^3$ protruding from the lateral walls $4^2$. The two lateral walls $4^2$ form a cavity housing light sources (not visible) and a collimator 10 in order to form a light beam for a direction indicator function.

The added part 6 comprises two supports $6^1$ and a rear part $6^2$. The supports $6^1$ are arranged in such a way as to protrude from the central part $4^1$ of the substrate 4 essentially opposite one another. Each of these supports $6^1$ supports a diode of the OLED type 8. An OLED is a light-emitting diode comprising a superposition of a number of organic semiconductor layers between two electrodes, of which (at least) one is transparent. In this case, these OLED diodes 8 ensure a side marker light function. The rear part $6^2$ of the added part 6 is configured to house an electrical power supply connector 14.

The substrate 4 of the module 2 also supports one or more light sources (not visible in FIG. 1 but clearly visible in FIG. 2) between the lateral walls $4^2$ and the OLED diodes 8, this or these light source(s) being covered by a collimator 12 in order to ensure a stop light function. More specifically, the rays emitted by these light sources and deflected by the collimator 12 to meet the front face of the corresponding OLED diode 8 and be reflected there toward the front of the module 2.

Figure 2:
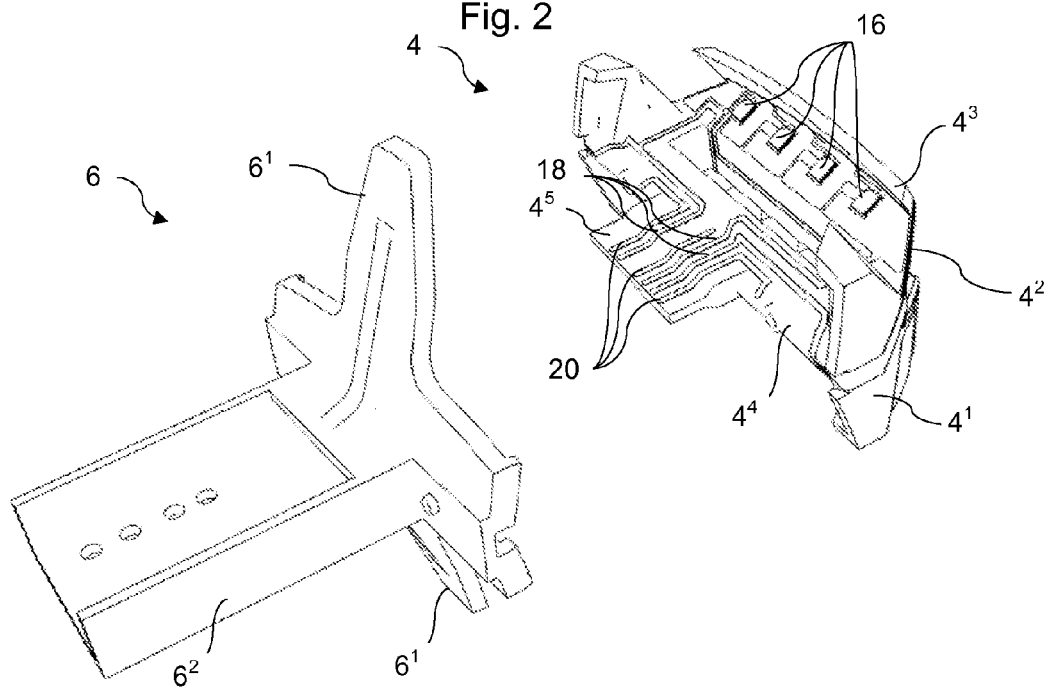
FIG. 2 is an exploded view of the light source support of the module of FIG. 1, the support comprising a substrate and an added part.

The longitudinal axis of the module 2 represented in FIGS. 1 and 2 corresponds to its optical axis. This means that the different light beams produced by the module 2 are oriented essentially along this axis. All these beams are preferentially directed toward the front of the module 2 (corresponding to the right in FIG. 1 and to the rear of the vehicle).

The collimators 10 and 12 are parts made of transparent or translucent material, such as glass or polycarbonate (PC). They comprise input and/or output surfaces oriented in such a way as to deflect the rays in a main direction, in application of the Snell-Descartes refraction principle. The input and output faces in effect each form a diopter, namely a surface separating two homogeneous and isotropic transparent media, of different refractive indices. The refractive index of air is in effect of the order of 1 whereas that of glass and of polycarbonate lies between approximately 1.4 and 1.6. The principle of operation of a collimator is well known in itself to those skilled in the art; there is consequently no need to give more detail thereof.

FIG. 2 gives an exploded illustration of the support of the light sources of the module 2. The support comprises the substrate 4 and the added part 6. The substrate 4 comprises, in its central portion, an extended portion $4^4$ and a portion $4^5$ protruding from the extended portion $4^4$. This protruding portion $4^5$ is intended to cooperate by engagement with the connector 6 (FIG. 1) for the electrical power supply of the light sources. Electrical tracks 18 are formed on the surface of the substrate 4, continuously from the light sources to the connection portion $4^5$. FIG. 2 illustrates the light sources 16 of the LED type arranged on the rear face of the upper side wall $4^2$, it being understood that a similar arrangement is provided on the lower side wall, this arrangement not being visible. Light sources (not visible), also of the LED type, are also provided between the two lateral walls $4^2$, at the bottom of the cavity formed by the walls. These light sources are also linked electrically by the electrical tracks 18.

The light sources 16 arranged directly on the substrate 4, are thus electrically powered by the electrical tracks 18 extending continuously from the lightsources to the connection portion $4^5$.

The presence of electrical tracks 20, the extent of which is limited to the rear edge of the extended portion $4^4$, can be seen in FIG. 2. The electrical tracks 20 serve to power the OLED surface light sources 8 (FIG. 1), as will be detailed in relation to the subsequent figures.

The substrate 4, including the connection portion $4^5$, is made of plastic material produced by molding and supports the light sources 16 and the electrical tracks 18 and 20, in accordance with the MID (Molded Interconnect Device) technology.

The plastic material of the substrate 4 can be doped with metal particles suitable for ensuring the bonding of the electrical tracks 18 and 20 made of metal material on its outer surface.

The electrical tracks 18 and 20 can be produced by the technology known by the acronym LDS, standing for "Laser Direct Structuring". This involves passing a laser ray over the corresponding surface of the substrate 4, according to the configuration of the electrical tracks 18 and 20 to be produced. The laser ray has the effect of forming a roughness suitable for favoring the bonding. This step is followed by dip-coating of the substrate 4 in one or more successive metal baths.

Alternatively, or complementarily, the electrical tracks 18 and 20 can be produced by printing of the inkjet type with ink that includes metal particles.

The electrical tracks 18 and 20 can also be produced by a two-step molding of the substrate 4, also called "two-shot molding". This is an injection molding process using two different resins in which only one of the two resins can be metalized. Typically, the metalizable resin is ABS and the non-metalizable resin is polycarbonate. The substrate 4 is then subjected to an autocatalytic deposition process in which butadiene is used to chemically roughen the surface and allow the adhesion of a primary layer of copper.

Because of the thermoplastic nature of the substrate 4, the use of conventional soldering methods for the electrical contacts is not suitable. The LEDs or light sources 16 are thus fixed mechanically and electrically by application of a glue based on polymer and filled with metal elements. It is thus a so-called "cold" application method that does not damage the substrate 4. After polymerization of the glue, the latter ensures the mechanical and electrical fixing of the LED or light source 16.

Figure 3:
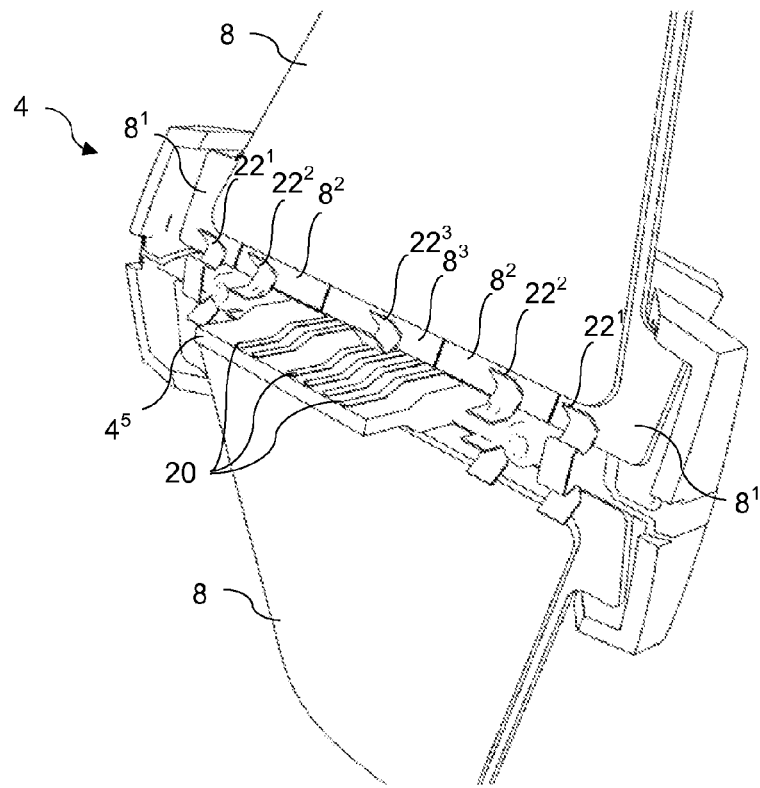
FIG. 3 is a detail view of the substrate, of the surface light sources of the OLED type and of the contact blades of the module of FIG. 1.

FIG. 3 gives a detailed illustration of the electrical connection between the OLED surface diodes 8 and the electrical tracks 20 of the substrate 4.

It can be seen that each of the two surface diodes 8 comprises five electrical contact zones $8^1$, $8^2$ and $8^3$ along their respective edges, these edges being adjacent to the extended portion $4^4$ of the substrate 4, on either side of the portion. The two zones $8^1$ are situated at the two ends of the edge of the surface diode 8 and are electrically linked, in the surface diode 8, to the cathode, or negative electrode, of the surface diode 8. The two contact zones $8^2$ are, within the surface diode 8, linked to a first anode, or positive electrode, while the contact zone $8^3$ is, for its part, linked, still within the surface diode 8, to a second anode. The first and second anodes cover different zones of the extent of the surface diode 8 whereas the cathode covers all of the zones of the two anodes. The surface diodes 8 thus exhibit two lighting zones which can be powered independently of one another. It should be noted that this configuration is purely exemplary, given that other configurations can be envisaged.

Still in FIG. 3, the presence of elastic contact blades $22^1$, $22^2$ and $22^3$ can also be observed. These elastic contact blades $22^1$, $22^2$ and $22^3$ are in reality supported by the added part 6 as will be detailed in relation to FIGS. 4 and 5. The elastic contact blades $22^1$, $22^2$ and $22^3$ are provided to ensure a contact with pressure, that is to say that requires neither soldering nor actual mechanical engagement. A first type of elastic contact blade $22^2$, $22^3$ is provided to ensure an electrical contact between the contact zones $8^2$, $8^3$ of the surface diodes 8 with the corresponding electrical tracks on the rear edge of the extended portion $4^4$. A second type of elastic contact blade $22^1$ ensures an electrical link between the two surface diodes 8, more specifically between their zones $8^1$ arranged facing, respectively. It should be noted that what is visible for the upper surface diode 8 is also visible for the lower surface diode 8. It should however be noted that, unlike the top face of the extended portion $4^4$ of the substrate 4, an electrical track is provided on the bottom face at the rear edge of said portion, level with at least one of the blades $22^1$ in order to ensure a grounding of the zones $8^1$ of the two surface diodes 8.

The elastic contact blades $22^1$, $22^2$ and $22^3$ can be produced from a leaf made of metal material.

Figure 4:
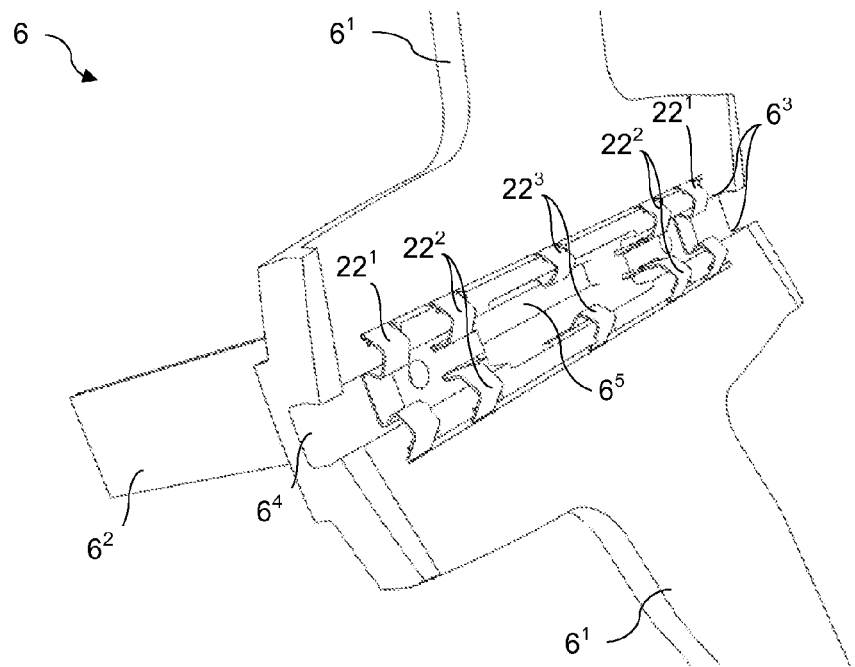
FIG. 4 is a detail view of the added part of the support of FIG. 2, the added part supporting the contact blades.
Figure 5:
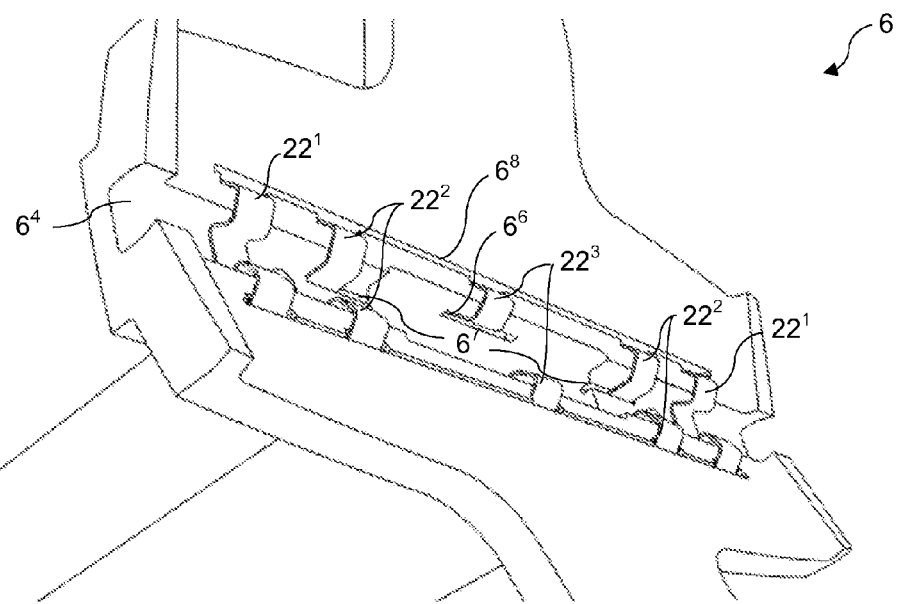
FIG. 5 is a view from another perspective of the added part of FIG. 4.
Figure 6:
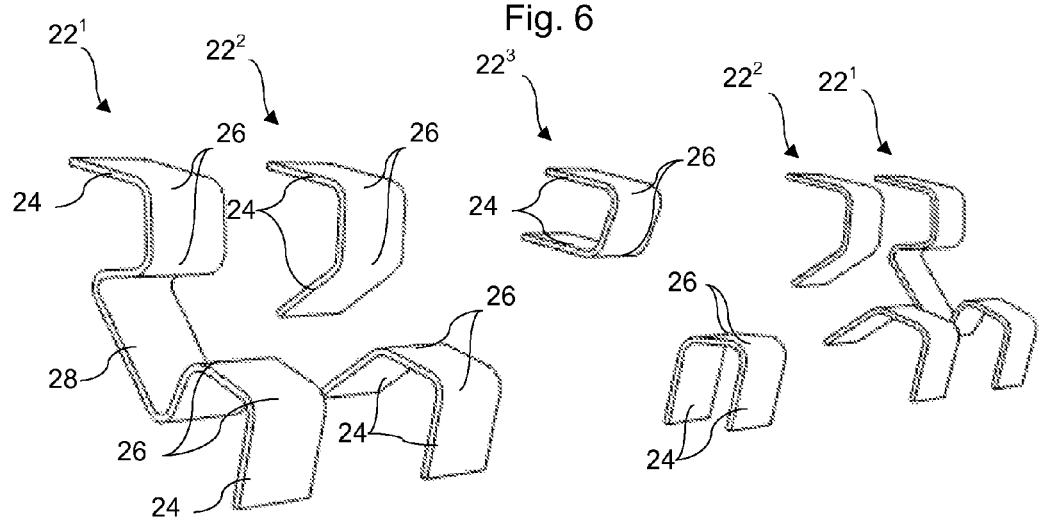
FIG. 6 is a view of the contact blades.

FIGS. 4 to 6 illustrate the added part and the elastic contact blades $22^1$, $22^2$ and $22^3$.

In FIGS. 4 and 5, it can be seen that the added part 6 comprises, on its front face, two edges $6^3$ overlapped by the elastic contact blades $22^1$, $22^2$ and $22^3$. The two edges $6^3$ extend essentially parallel to one another on either side of a main groove $6^4$. The latter is intended to receive the rear edge of the extended portion $4^4$ of the substrate 4 (FIGS. 2 and 3). The added part 6 also comprises an orifice $6^5$ in the bottom and at the center of the groove $6^4$, this orifice $6^5$ being intended to receive the connection portion 20 of the substrate 4 (FIGS. 2 and 3).

More particularly with reference to FIG. 5, it can be seen that the added part 6 comprises guiding grooves $6^6$, $6^7$ and $6^8$, these guiding grooves $6^6$, $6^7$ and $6^8$ slidingly receiving the ends of the elastic contact blades $22^1$, $22^2$ and $22^3$.

With reference to FIG. 6, it can be seen that each of the elastic contact blades $22^1$, $22^2$ and $22^3$ comprises, at both of its ends, generally planar portions 24. It will be observed also that each of the elastic contact blades $22^1$, $22^2$ and $22^3$ forms at least two bent portions 26. More specifically, the elastic contact blades $22^2$ and $22^3$ each have a generally U-shaped profile so as to form the two bent portions 26 and the two planar portions 24. The elastic contact blades $22^2$, however, have a flared profile whereas the elastic contact blades $22^3$ have a profile whose edges, or even planar portions 24, are generally parallel. The elastic contact blades $22^1$ are somewhat different in that their profile comprises two U-shaped lateral portions and a central portion 28 linking the two lateral portions. The central portion 28 extending from the planar portions 26 also forms a U which is, however, generally opposite the U-shapes of the lateral portions. The central portion 28 is intended to be housed in the bottom of the groove $6^4$ of the added part 6, as can be seen in FIGS. 4 and 5.

The bent portions 26 of the elastic contact blades $22^1$, $22^2$ and $22^3$ are intended to contact the electrical contact zones $8^1$, $8^2$ and $8^3$ of the surface diodes 8 and the electrical tracks 20 on the substrate 4 (FIGS. 2 and 3).

While the system, apparatus, process and method herein described constitute preferred embodiments of this invention, it is to be understood that the invention is not limited to this precise system, apparatus, process and method, and that changes may be made therein without departing from the scope of the invention which is defined in the appended claims.

What is claimed is:

1. A support for light source(s) for a light module for a motor vehicle, comprising:
   a part;
   a substrate;
   at least one surface light source, said at least one surface light source being an organic light-emitting diode mounted on said part, said at least one surface light source comprising at least two electrical contact zones;
   electrical tracks deposited on said substrate; and
   electrical contacts between said electrical tracks and said at least two electrical contact zones of said at least one surface light source;
   wherein said electrical contacts comprise elastic blades in contact under pressure with said at least two electrical contact zones of said at least one surface light source and with said electrical tracks.

2. The support according to claim 1, wherein said at least two electrical contact zones of said at least one surface light source in electrical contact with said electrical track forms an angle with said at least two electrical contact zones of said electrical track in contact with said elastic blade, said angle being greater than 30°.

3. The support according to claim 1, wherein each of said elastic blades comprises at least two bent portions, each of said at least two bent portions being in contact with one of said electrical contact zones of said at least one surface light source or with one of said electrical tracks.

4. The support according to claim 1, wherein each of said elastic blades comprises, on at least one of its ends, a generally planar portion suitable for sliding along a guiding surface.

5. The support according to claim 1, wherein said part comprises an added part supporting said elastic blades.

6. The support according to claim 4, wherein an added part comprises said guiding surfaces for planar end portions of said elastic blades.

7. The support according to claim 6, wherein said added part comprises guiding grooves forming said guiding surfaces and receiving said planar end portions of said elastic blades.

8. The support according to claim 5, wherein said added part comprises at least one edge supporting said elastic blades.

9. The support according to claim 8, wherein said added part comprises two edges supporting said elastic blades, said edges extending essentially parallel to one another, said added part comprising a main groove between said edges, said main groove receiving the edge of an extended portion of said substrate.

10. The support according to claim 9, wherein said elastic blades comprise first elastic blades each overlapping exclusively one of said two edges.

11. The support according to claim 10, wherein said first elastic blades have a generally U-shaped profile and ensure an electrical contact between said electrical tracks and said at least two electrical contact zones of said at least one surface light source.

12. The support according to claim 10, wherein said elastic blades comprise second elastic blades, each of said second elastic blades overlapping said two edges and extending through said main groove of said added part.

13. The support according to claim 12, wherein said second elastic blades have a profile comprising two generally U-shaped lateral portions each overlapping one of said two edges and a generally U-shaped central portion, opposite said two generally U-shaped lateral portions.

14. The support according to claim 12, wherein said second elastic blades ensure an electrical contact between said at least two electrical contact zones of said at least one surface light source arranged on either side of said extended portion of said substrate.

15. The support according to claim 5, wherein an edge of an extended portion of said substrate forms a protruding tongue, said electrical tracks on said substrate extending to said tongue, said added part comprising a notch or an opening suitable for receiving said tongue so as to form a space for said tongue to engage with an electrical connector.

16. A light module for a motor vehicle, comprising a support for light source(s) and at least one optical device, wherein said support conforms to claim 1.

17. The support according to claim 2, wherein each of said elastic blades comprises at least two bent portions, each of said at least two bent portions being in contact with one of said electrical contact zones of said at least one surface light source or with one of said electrical tracks.

18. The support according to claim 2, wherein each of said elastic blades comprises, on at least one of its ends, a generally planar portion suitable for sliding along a guiding surface.

19. The support according to claim 3, wherein each of said elastic blades comprises, on at least one of its ends, a generally planar portion suitable for sliding along a guiding surface.

20. The support according to claim 5, wherein said added part comprises the guiding surfaces for planar end portions of said elastic blades.

* * * * *